United States Patent
Oh

(10) Patent No.: US 9,137,923 B2
(45) Date of Patent: Sep. 15, 2015

(54) PORTABLE DEVICE HAVING A SLIDING MOTION OR ROTATING/TILTING DISPLAY UNIT

(76) Inventor: June Soo Oh, Seoul (KR)

( * ) Notice: Subject to any disclaimer, the term of this patent is extended or adjusted under 35 U.S.C. 154(b) by 198 days.

(21) Appl. No.: 13/812,214

(22) PCT Filed: Jul. 29, 2011

(86) PCT No.: PCT/KR2011/005585
§ 371 (c)(1),
(2), (4) Date: Jan. 25, 2013

(87) PCT Pub. No.: WO2012/015266
PCT Pub. Date: Feb. 2, 2012

(65) Prior Publication Data
US 2013/0128465 A1    May 23, 2013

(30) Foreign Application Priority Data

Jul. 29, 2010 (KR) .................. 10-2010-0073671
Jun. 16, 2011 (KR) .................. 10-2011-0058510
Jul. 23, 2011 (KR) .................. 10-2011-0073330

(51) Int. Cl.
*H05K 7/16* (2006.01)
*G06F 1/16* (2006.01)
(Continued)

(52) U.S. Cl.
CPC *H05K 7/16* (2013.01); *G06F 1/165* (2013.01); *G06F 1/1624* (2013.01); *G06F 1/1681* (2013.01); *H04M 1/0237* (2013.01); *H04W 52/027* (2013.01); *H04M 1/0216* (2013.01)

(58) Field of Classification Search
USPC ............. 361/679.27, 679.01, 679.05, 679.09, 361/679.11, 679.26, 679.3, 679.43, 807; 16/260, 330, 303, 342, 361, 14, 223, 16/258, 266, 297, 319, 362; 455/575.4, 455/575.1, 575.3, 566; 248/923, 349.1, 248/371; 312/223.2, 208.1, 223.1; 403/146, 403/53, 63

See application file for complete search history.

(56) References Cited

U.S. PATENT DOCUMENTS

2006/0059659 A1*  3/2006  Kim et al. .................. 16/330
2008/0161075 A1*  7/2008  Kim et al. .................. 455/575.4
(Continued)

FOREIGN PATENT DOCUMENTS

KR  10-2006-0094512 A  8/2006
KR     10-0822649 B1    4/2008

OTHER PUBLICATIONS

STIC search, Nov. 26, 2014.*
(Continued)

*Primary Examiner* — Hung S Bui
*Assistant Examiner* — Michael Matey
(74) *Attorney, Agent, or Firm* — The PL Law Group, PLLC

(57) ABSTRACT

A portable device which incorporates a body unit and a display unit incorporating a display screen formed on the front surface and/or the rear surface. The body unit includes sidewalls formed projecting forwards from the left and right side surfaces of the body unit so as to allow the display unit to rest in a stable fashion. Each sidewall of the body unit has a holding member of which one end is secured to one region of the sidewall. A portion of the holding member is positioned inside the display unit. A movement hole is formed in the side surface of the display unit. A portion of the holding member passes through the movement hole so as to allow the display unit to slide on the main body.

20 Claims, 15 Drawing Sheets

(51) Int. Cl.
*H04W 52/02* (2009.01)
*H04M 1/02* (2006.01)

(56) References Cited

U.S. PATENT DOCUMENTS

| | | | |
|---|---|---|---|
| 2010/0087232 A1* | 4/2010 | Yeh et al. | 455/575.4 |
| 2010/0149733 A1* | 6/2010 | Luke et al. | 361/679.01 |
| 2010/0210311 A1* | 8/2010 | Ahn et al. | 455/566 |
| 2010/0259872 A1* | 10/2010 | Yang et al. | 361/679.01 |
| 2011/0199718 A1* | 8/2011 | Stone et al. | 361/679.01 |

OTHER PUBLICATIONS

International Search Report for PCT/KR2011/005585.

* cited by examiner

PORTABLE DEVICE HAVING A SLIDING MOTION OR ROTATING/TILTING DISPLAY UNIT

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2011/005585, filed Jul. 29, 2011, which claims priority to Korean Patent Application Nos. 10-2010-0073671 which was filed Jul. 29, 2010, 10-2011-0058510 which was filed Jun. 16, 2011, and 10-2011-0073330 which was filed Jul. 23, 2011, entire contents of which are incorporated herein by reference.

BACKGROUND

1. Technical Field a. The present invention relates to a portable device that can slide/glide or rotate/tilt, and more particularly, to a portable device structure which has a display screen on the front or rear surface of a display unit of a portable device, in which the display unit can be slid, tilted to a predetermined angle or rotated to turn 180 degrees without interruption for use.

2. Background Art

Various types of portable devices have been proposed in response to the development of telecommunication devices. According to current trends, a variety of functions are added to portable devices for use. That is, a portable device can serve as an MPEG-1 Audio Layer-3 (MP3) player, a digital multimedia broadcasting (DMB) receiver or a personal digital assistant (PDA). In addition, a user can play moving images, enjoy application programs (apps), check email, search for information (on the Internet), edit a document (e.g. using MS Office), and so on.

For execution of those functions, a large display screen which can display various sorts of image information and entertainment apps is required. However, a portable device that also has the function of a mobile phone has various types of function buttons on the portion where the display screen is located. This consequently reduces the size of the display screen.

In the related art, a portable media player (PMP), a type of the above-described portable devices, has a large screen (e.g. 4.3", 4.0" or the like), which consumes more power than a small screen (e.g. 2.2", 2.0" or the like). Therefore, for the MP3 player (MP3P) function or the voice speaking function, the PMP unnecessarily uses "the large screen that consumes high power," which is one factor that reduces the usage time.

Therefore, it is required to minimize the battery consumption and increase the usage time by using "a small screen that consumes low power" in the speaking function of a mobile communication terminal or in the MP3P function. Also, regarding the visual or functional aspect of a product, it is required that usability and convenience are provided by using the large screen (e.g. 4.3", 4.0" or the like) for some functions, such as PMP, navigation, ultra-mobile personal computer (UMPC), game player, web surfing and email functions, and using the small screen (e.g. 2.2", 2.0" or the like) for some functions, such as mobile phone, MP3P and short message service (SMS) functions.

In addition, since a user individually purchases various sorts of portable devices, such as an MP3P, a DMB receiver, a PMP, a PDA, a PlayStation portable (PSP), a UMPC, a navigator, a mobile phone and the like, as required, he/she spends too much money. Disposal of respective devices also causes environmental pollution and wastes of resources.

SUMMARY

The present invention has been made to solve the foregoing problems with the related art, and therefore the present invention is intended to provide a portable device structure which has a small display screen and a large display screen respectively on both surfaces of a display unit which is coupled with a body such that it can slide/glide on or rotate/tilt about the body. The small display screen is used for a voice speaking function, and the large display screen is used for displaying images and playing entertainment apps, so that a variety of functions can be carried out. It is also convenient for a user to view information on the display screens or execute an operation.

The present invention is also intended to provide a portable device structure in which various types of portable devices (e.g., an MP3P, a DMB receiver, a PMP, a PDA, a PSP, a UMPC, a navigator, a mobile phone and the like) which exist as separate articles to realize their own functions in the related art are integrated into one terminal such that the functions can be carried out by rotating a display unit into a desirable operation mode. Specifically, the MP3P function, the voice speaking function that is the unique function of the mobile phone, and the like can be carried out using a front display screen, whereas the PSP function, the DMB receiver function, the PMP function of playing a movie stored in a memory, the PDA function of displaying information, the function of the UMPC which is also referred to as a PC in the hand, the navigation function and the like are carried out using a rear display screen.

The present invention is also intended to provide a portable device structure in which front and rear display screens are erected when a display unit is raised about a slider such that a user can view information displayed on the front and rear display screens at a convenient angle, and the display unit can be rotated back and forth when the display unit is turned while the slider is pushed in one direction in the state in which the display is erected.

The present invention is also intended to slide a display unit on a body unit without shaking, and to prevent a cable which connects between the body unit and the display unit from being damaged by locating the cable inside the display.

The present invention is also intended to provide a portable device which is convenient to carry and use by reducing the thickness of a body unit, the thickness of a display unit, and the size of the display device.

The present invention is also intended to provide raise-preventing stepped portions which are disposed on the bottoms of the left and right outer side surfaces of a display unit. The raise-preventing stepped portions prevent the lower part of the display unit from being raised further above the horizontal line of a rotary shaft (i.e. a rotation holding member or a holding member) or the upper part of the display unit from being lowered below the horizontal line of the rotary shaft as the display unit stops sliding upward on a body unit (i.e. stops due to completion of sliding), that is, just before the display unit starts rotation to tilt to a predetermined angle or turn back 180 degrees. In addition, stepped portion slip guide recesses which correspond to the raise-preventing stepped portions are formed along both the sidewalls so that the raise-preventing stepped portions can be inserted into and slide along the inner side surfaces of the sidewalls of the body unit.

In order to realize the foregoing object, according to an aspect of the invention, provided is a portable device which includes a display unit and a body unit, the display unit having a display screen disposed on at least one of a front surface and a rear surface. The body unit has sidewalls which protrude forward from left and right side sections of the body unit such that the display unit can rest between the sidewalls. The sidewalls of the body unit include a fixed hinge shaft, one end of the fixed hinge shaft being fixed to a portion of the sidewalls, a portion of the fixed hinge shaft being located inside the display unit. The display unit has a movement hole in a side surface thereof, the portion of the fixed hinge shaft extending through the movement hole such that the display unit can slide on the body unit.

According to a characteristic of the invention, it is preferred that the display unit have protrusions on both side surfaces thereof, the protrusions extending in a vertical direction.

According to a characteristic of the invention, it is preferred that the protrusions be formed on the side surfaces of the display unit, and the protrusions be formed on predetermined portions of the side surfaces of the display unit except for lower portions of the side surfaces such that the display unit is rotatable about the body unit.

According to a characteristic of the invention, it is preferred that the body unit have first guide recesses in inner side surfaces of the sidewalls, the protrusions of the display unit being insertable into the first guide recesses so as to slide, and second guide recesses in front surfaces of the sidewalls which allow the display unit to rotate about the body unit and then closely adjoin the body unit.

According to a characteristic of the invention, it is preferred that the portion of the sidewalls of the body unit to which the fixed hinge shaft is fixed be higher than portions where the first guide recesses are formed and be located in the inner side surfaces of the sidewalls of the body unit.

According to a characteristic of the invention, it is preferred that a recess which extends in a lateral direction be formed in an upper portion of an area of the body unit between the sidewalls, and that a keyboard be disposed in an area below the recess which extends in the lateral direction.

According to a characteristic of the invention, it is preferred that the sidewalls have a battery therein.

According to a characteristic of the invention, it is preferred that the battery be disposed in an orientation that is rotated to a predetermined angle to minimize a width and thickness of the sidewalls.

According to a characteristic of the invention, it is preferred that the body unit have a circuit board inside a central portion thereof, and that a rear side of the body unit have a metal plate which dissipates heat.

According to a characteristic of the invention, it is preferred that the display unit have a display screen which is provided to occupy substantially an entire area of a first surface of the display unit, another display screen which is provided to occupy a portion of a second surface of the display unit, and a printed circuit board is disposed in a remaining portion of the second surface of the display unit.

According to a characteristic of the invention, it is preferred that the portable device may further include a cable which transmits at least one of a signal and power between the display unit and the body unit.

According to a characteristic of the invention, it is preferred that a portion of the cable be introduced into the body unit through the fixed hinge shaft.

According to a characteristic of the invention, it is preferred that the portion of the cable be introduced downward of the body unit through an inside of the fixed hinge shaft and be bent backward of the fixed hinge shaft toward above the body unit.

According to a characteristic of the invention, it is preferred that the portion of the cable be attached to a ceiling of a front inner wall of the display unit and be electrically connected to a circuit inside the display unit, and that the cable has a structure that be twisted or bent once before a point where a portion of the cable is attached to the ceiling of the front inner wall.

According to a characteristic of the invention, it is preferred that the cable distribute resources between circuits which are respectively included by the body unit and the display unit.

According to a characteristic of the invention, it is preferred that the portable device may further include an interlock member having a recess in a surface which faces a sidewall of the sidewalls of the body unit, the interlock member being coupled with the fixed hinge shaft; a rotation holding member which moves integrally with the display unit when the display unit slides and is coupled with the interlock member to serve as a center of rotation when the display unit rotates; and an elastic member which provides elastic force to the rotation holding member. The fixed hinge shaft has a bent central portion.

According to a characteristic of the invention, it is preferred that the portable device may further include a fixing stepped portion which prevents the elastic member from being dislodged outward, the fixing stepped portion surrounding and fixing one end of the elastic member.

According to a characteristic of the invention, it is preferred that the interlock member have a first linear recess in a surface which is opposite the surface coupled with the corresponding fixed hinge shaft, the first linear recess being formed parallel to a direction in which the display unit slides and closed in one direction, and one or more second linear recesses formed a different angle from the first linear recess, that the rotation holding member have a linear protrusion on a surface which faces a corresponding sidewall of the sidewalls of the body unit, the linear protrusion being formed parallel to the direction in which the display unit slides, and that the linear protrusion of the rotation holding member be insertable into at least one of the first linear recess and the one or more second linear recesses.

According to a characteristic of the invention, it is preferred that the display unit may further include a guide rail on an inner wall of a front or rear surface thereof, the guide rail being formed along a path along which the bent central portion of the fixed hinge shaft moves when the display unit slides.

According to a characteristic of the invention, it is preferred that the inside of the display unit in which the portion of the fixed hinge shaft is located have a cylindrical shape.

According to a characteristic of the invention, it is preferred that the portable device may further include a rotation holding member having a linear protrusion on a surface thereof which faces inward, the linear protrusion being formed substantially parallel to a direction in which the display unit slides; an elastic member which provides restoring force for pushing the rotation holding member outward; and an interlock member having a first linear recess in a surface which faces the fixed hinge shaft, the first linear recess being formed parallel to the direction in which the display unit slides, and one or more second coupling recesses formed at a different angle from the first linear recess. The fixed hinge shaft has an insert recess in a terminal end thereof, the insert recess being formed such that an entrance thereof faces a central portion, the elastic member is disposed inside the insert recess, and the central portion of the fixed hinge shaft has a flat shape.

According to a characteristic of the invention, it is preferred that the interlock member move integrally with the display unit when the display unit slides and be coupled with the rotation holding member to serve as a center of rotation when the display unit rotates.

According to a characteristic of the invention, it is preferred that the insert recess have a fixing stepped portion, that the rotation holding member have a stepped portion such that an outer portion thereof is thicker, and that the fixing stepped portion of the insert recess and the stepped portion of the rotation holding member prevent the rotation holding member from being dislodged from the insert recess.

According to a characteristic of the invention, it is preferred that the display unit further include a protective film disposed inside a sidewall thereof, the protective film closing the movement hole from an outside, the protective film being made of an elastic material.

According to a characteristic of the invention, it is preferred that a portion of the protective film which adjoins the fixed hinge shaft has a circular shape.

According to a characteristic of the invention, it is preferred that the display unit further include a protective film-receiving recess in an upper part thereof adjacent to the inner sidewall, the protective film-receiving recess being laterally formed. A portion of the protective film enters and exits the protective film-receiving recess as the display unit slides on the body unit.

According to a characteristic of the invention, it is preferred that the fixed hinge shaft be divided into two sections and further include a ring which surrounds the two sections in order to prevent the two sections from being widened by external force.

According to a characteristic of the invention, it is preferred that raise-preventing stepped portions be disposed on the bottoms of the left and right outer side surfaces of a display unit. The raise-preventing stepped portions prevent the lower part of the display unit from being raised further above the horizontal line of a rotary shaft (i.e. a rotation holding member or a holding member) or the upper part of the display unit from being lowered below the horizontal line of the rotary shaft as the display unit stops sliding upward on a body unit (i.e. stops due to completion of sliding), that is, just before the display unit starts rotation to tilt to a predetermined angle or turn back 180 degrees. It is also preferred that stepped portion slip guide recesses which correspond to the raise-preventing stepped portions be formed along both the sidewalls so that the raise-preventing stepped portions can be inserted into and slide along the inner side surfaces of the sidewalls of the body unit.

According to another aspect of the invention, provided is a portable device which includes a display unit and a body unit, the display unit having a display screen disposed on at least one of a front surface and a rear surface. The body unit has sidewalls which protrude from left and right side sections of the body unit such that the display unit rests between the sidewalls. The sidewalls of the body unit include a holding member, one end of the holding member being fixed to a portion of the sidewalls, a portion of the holding member being located inside the display unit. The display unit has a movement hole in a side surface thereof, the portion of the holding member extending through the movement hole such that the display unit can slide on the body unit.

According to a characteristic of the invention, it is preferred that the display unit have a rotary hinge shaft in a side portion thereof, the rotary hinge shaft being configured as a C-shaped ring which has an opening, the opening being formed in a direction opposite to a direction in which the display unit slides, such that the holding member can rest into the rotary hinge shaft configured as the C-shaped ring through the opening.

According to a characteristic of the invention, it is preferred that an interlock member be disposed in at least a portion of the holding member, the interlock member surrounding an outer circumference of the holding member, an outer diameter of the interlock member being equal to an outer diameter of the rotary hinge shaft, the interlock member adjoining the rotary hinge shaft when the holding member rests inside the rotary hinge shaft, and that an elastic member be disposed between one end of both ends of the interlock member and one end of both ends of the holding member which are disposed on a sidewall of the sidewalls of the body unit, the elastic member surrounding the holding member.

According to a characteristic of the invention, it is preferred that surfaces of the rotary hinge shaft and the interlock member which adjoin each other have a plurality of protrusions and recesses, and that elastic force of the elastic member be maximum when the protrusions formed on the rotary hinge shaft adjoin the protrusions formed on the interlock member.

According to a characteristic of the invention, it is preferred that a cable through-hole be formed in an axial direction in the holding member.

According to a characteristic of the invention, it is preferred that the portable device further include a guide rail extending from the opening of the rotary hinge shaft, the guide rail guiding a movement of the holding member when the display unit slides.

According to embodiments, the guide recesses in the front surface of the display unit of the portable device are closed at one end. When the display unit is flipped and turned back such that the second surface of the display unit faces forward, the protrusions on the opposite side surfaces of the display unit can be fixedly inserted into the recesses in the front surface of the body unit. Since the stepped portions are formed, it is easy to hold the device with the hand. In addition, the thickness of the display unit can be advantageously reduced.

According to embodiments, since the body unit of the portable device has the fixed hinge shaft and the cable is drawn through a portion of the fixed hinge shaft, the cable is prevented from wearing, which is advantageous.

According to embodiments, since the body unit has the recesses and the display unit has the protrusions which are to be inserted into the recesses of the body unit, there is an advantageous effect in that vibration which occurs when the display unit slides on the body unit can be prevented.

According to embodiments, the display unit of the portable device has the movement holes through which predetermined portions of the fixed hinge shaft can move and the protective rails or protective films which close the movement holes from inside, thereby blocking the inside of the display unit from the outside. As advantageous effects, it is possible to prevent foreign matters from entering and prevent the cable or the like inside the display unit from being damaged by a pen or an awl.

DETAILED DESCRIPTION

Reference will now be made in detail to various embodiments of the present invention, examples of which are illustrated in the accompanying drawings and described below. It is to be understood that the accompanying drawings are illustrated for the enhancement of understanding of the present invention. It will be apparent to a person having ordinary skill in the art that the scope of the invention is not defined by the accompanying drawings.

EXEMPLARY EMBODIMENTS OF THE INVENTION

Overall Construction of Portable Device

Figure 1:
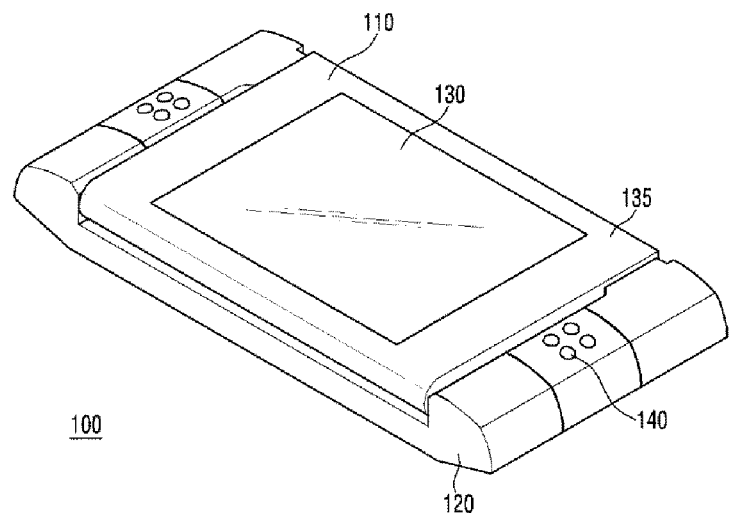
FIG. 1 is a perspective view showing a portable device according to an embodiment of the invention.

FIG. 1 is a perspective view showing a portable device according to an embodiment of the invention.

The portable device includes a display unit 110 and a body unit 120. The display unit 110 includes a first display 130, and is positioned such that a first surface 135 faces forward. Buttons 140 can be positioned in the upper portions of the left and right sections of the body unit 120. Here, the state in which the first display 130, i.e. a wide display, faces forward is defined as a first mode of the portable device, whereas the state in which a second display 170 smaller than the first display 130 faces forward is defined as a second mode of the portable device. Although the first display 130 is defined to be greater than the second display 170 for the sake of description, the scope of the invention is not limited thereto. Rather, the sizes of displays can vary depending on the design.

Figure 2:
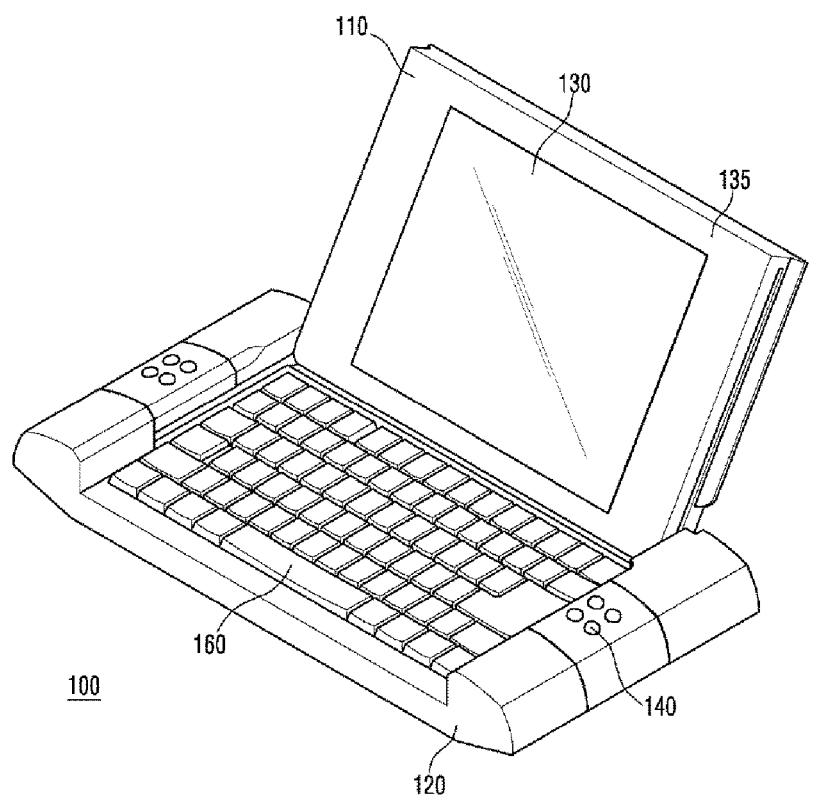
FIG. 2 is a view showing the display unit of the portable device according to an embodiment of the invention which is slid and rotated to a predetermined angle.

FIG. 2 is a view showing the display unit of the portable device according to an embodiment of the invention which is slid and rotated to a predetermined angle. The display unit 110 can slide upward and parallel to the body unit 120. After the display unit 110 has completed sliding, the display unit 110 can rotate about a reference shaft. The portable device 100 which has rotated to a predetermined angle can expose a keyboard 160 inside the body unit 120. The keyboard 160 is exposed outward when the portable device is converted from the first mode into another mode. In this state, a user can use the portable device as a computer using the keyboard 160 and the first display 130.

Figure 3:
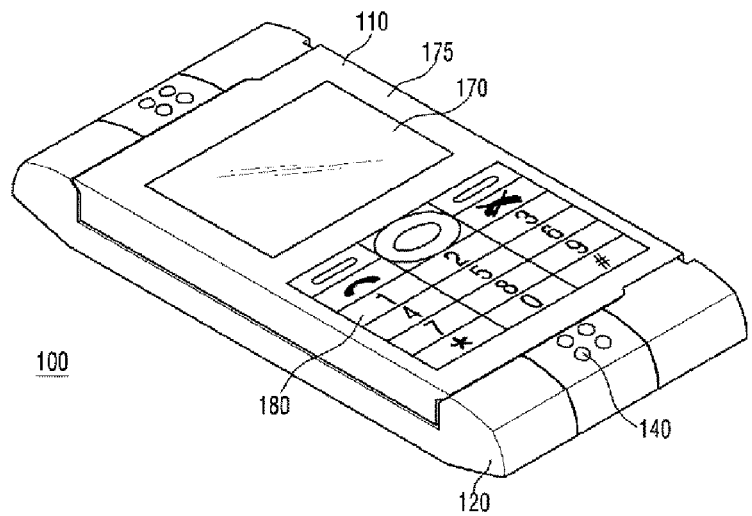
FIG. 3 is a view showing a second surface of the display unit of the portable device according to an embodiment of the invention which is directed upward.

FIG. 3 is a view showing the second surface of the display unit of the portable device according to an embodiment of the invention which is directed upward.

When the display unit 110 shown in FIG. 2 is rotated further (e.g. to 180 degrees), the display unit is coupled with the body unit. That is, the portable device is arranged such that a second surface 175 of the display unit 110 faces upward. The second display 170 and a keypad 180 can be disposed on the second surface 175. As defined above, the state of the portable device in which the second display 170 faces upward can be defined as the second mode. The user can use the portable device as a mobile phone using the second display 170 and the keypad 180. Although an example for the keypad 180 and the second display 170 is shown in FIG. 3 in order to describe the concept of the invention, the scope of the invention is not limited thereto. The arrangement of keys of the keypad 180 and the shape, size or the like of the second display 170 can be changed.

Detailed descriptions will be given below of respective components of portable devices according to various embodiments of the invention.

First Embodiment

Figure 4A:
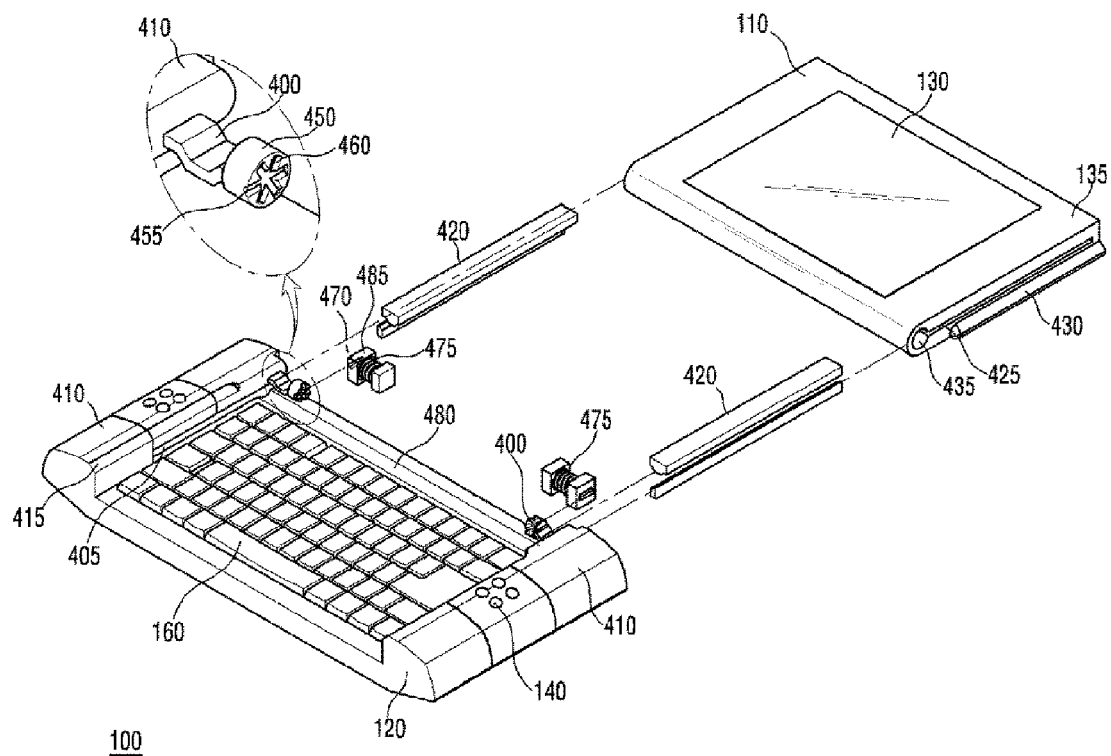
FIG. 4A is an exploded perspective view showing respective components of a portable device according to a first embodiment of the invention.
Figure 4B:
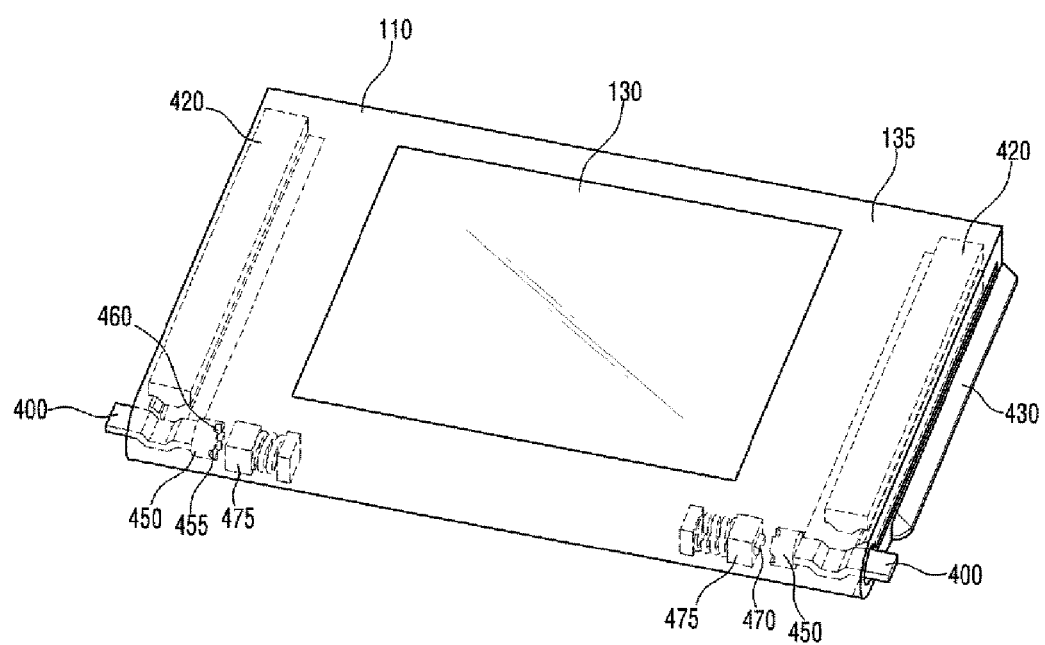
FIG. 4B shows the display unit of the portable device according to the first embodiment of the invention.

FIG. 4A is an exploded perspective view showing respective components of a portable device according to a first embodiment of the invention, and FIG. 4B shows only the display unit of these components.

The body unit 120 of the portable device has sidewalls 410 on left and right sections of the body unit. The sidewalls 410 protrude such that they face left and right side surfaces of the display unit 110 so that the display unit 110 can rest therebetween. The body unit 120 also has fixed hinge shafts 400 which are respectively fixed to predetermined portions of the sidewalls 410. The fixed hinge shafts 400 are partially located inside the display unit 110. The display unit 110 has movement holes 425 formed in side surfaces thereof. Predetermined portions of the fixed hinge shafts 400 respectively extend through the movement holes 425 such that the display unit 110 can slide on the body unit 120. Circular holes 435 are respectively formed on terminal ends of the movement holes 425 such that the fixed hinge shafts 400 rotate inside the circular holes 435 when the display unit 110 rotates.

The display unit 110 can include protrusions 430 on both side surfaces thereof, the protrusions extending in the vertical direction. The protrusions 430 can be formed on predetermined portions of the side surfaces of the display unit 110 such that the display unit 110 can rotate about the body unit 120. First guide recesses 405 are respectively formed in inner surfaces of the sidewalls 410 of the body unit 120 such that the protrusions 430 of the display unit 110 can be inserted into and slide in the guide recesses 405. Second guide recesses 415 can be respectively formed in the front sections of the sidewalls 410 of the body unit 120 such that the display unit 110 can closely adjoin the body unit 120 after having rotated about the body unit 120. The first guide recesses 405 of the body unit 120 and the protrusions 430 of the display unit 110 serve to prevent vibration when the display unit 110 is sliding, so that the display unit 110 can smoothly slide.

Portions where the fixed hinge shafts 400 are respectively coupled with the sidewalls 410 of the body unit 120 are higher than portions in which the first guide recesses 405 are formed and are located in the inner side surfaces of the sidewalls 410 of the body unit 120. That is, the fixed hinge shafts 400 are located adjacent to end portions of the sidewalls 410, serve as the center of rotation when the display unit 110 rotates, and serve as a stopper which prevents the display unit 110 from sliding any further when the display unit 110 is moving in the second mode after having slid in the first mode.

A recess 480 which extends in the lateral direction, i.e. in the left-right direction, can be formed in the upper portion of the area of the body unit 120 between the sidewalls 410. The recess 480 helps the display unit 110 smoothly rotate without interruption, and serves to support and guide the display unit 110. The keyboard 160 can be disposed in a portion below the recess 480.

Recesses can be respectively formed in the surfaces of the body unit 120 that face the sidewalls. Due to this configuration, interlock members 450 which are coupled with the fixed hinge shafts 400 can be formed on terminal ends of the fixed hinge shafts 400. Here, it is preferred that the interlock members have a cylindrical shape such that the display unit 110 can rotate.

Rotation holding members 485 can also be provided. When the display unit slides, the rotation holding members 485 integrally move along with the display unit 110. When the display unit 110 rotates, the rotation holding members 485 are coupled with the interlock member 450 and serve as the center of rotation together with the interlock member 450.

Each of the rotation holding members 485 can have an elastic member 475 on one end thereof which provides elastic force. The side cross-section of the rotation holding members 485 can have a shape selected from among a circle, a quadrangle, a polygon or the like.

It is preferred that the fixed hinge shafts 400 be configured such that the central portion thereof is bent.

Each of the interlock members 450 can have a first linear recess 455 in a surface which is opposite the surface coupled with the corresponding fixed hinge shaft 400. The first linear recess 455 is formed parallel to the direction in which the display unit 110 slides. Each of the interlock members 450 can also has one or more second linear recesses 460 which are formed at a different angle from the first linear recess 455. Each of the rotation holding members 485 has a linear protrusion 470 on the surface thereof that faces the corresponding sidewall 410 of the body unit 120. The linear protrusion 470 is parallel to the direction in which the display unit slides. Each linear protrusion 470 of the rotation holding member can be configured such that it can be inserted into at least one of the first linear recess 455 and the second linear recesses 460.

The first linear recesses 455 are closed only in one direction. This is because the first linear recesses 455 must be closed in one direction such that the linear protrusions 470 of the rotation holding members 485 are caught so that the display unit 110 which has slid from the first mode is fixed just before it rotates.

In addition, the display unit 110 can also include guide rails 420 on inner walls of the front or rear surface thereof. The guide rails 420 are formed along a path along which the bent central portions of the fixed hinge shafts 400 move during the sliding. The guide rail 420 can protect the inside of the display unit 110 which would otherwise be exposed through the movement holes 425. In particular, since cables or the like which are located inside the display unit 110 can be damaged through the movement holes 425, the guide rails 420 protect these components. The guide rails also serve to help the display unit move along the fixed hinge shafts 400 without vibration.

In addition, it is preferred that the inside of the display unit 110 in which predetermined portions of the fixed hinge shafts 400 are located have a cylindrical shape. That is, the circular holes 435 formed in the display unit 110 have a cylindrical shape.

FIG. 5A to FIG. 5D are perspective views showing the display unit of the portable device according to an embodiment of the invention which has sequentially moved about the body unit.

Figure 5A:
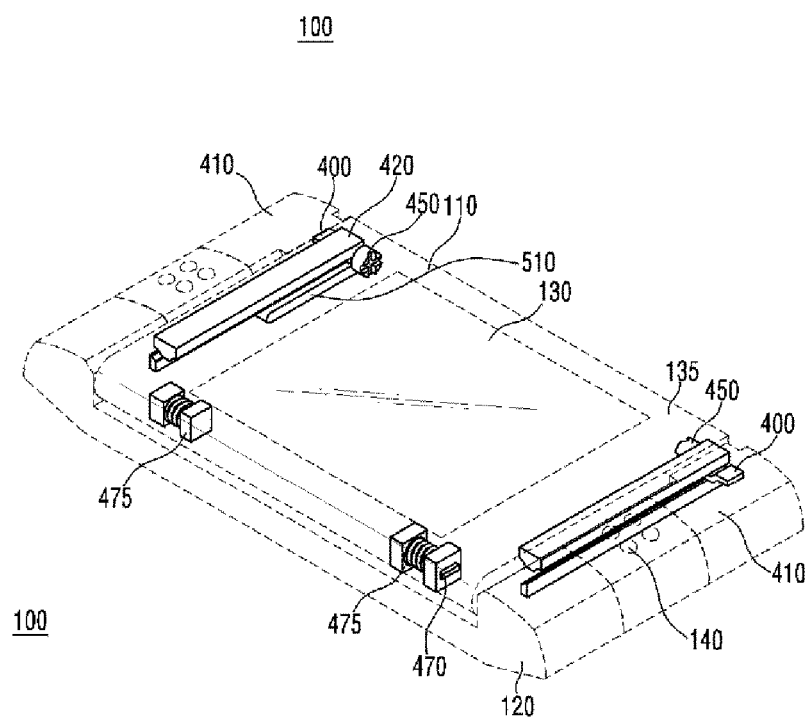
FIG. 5A to FIG. 5D are perspective views showing the display unit of the portable device according to the first embodiment of the invention which sequentially moves on the body unit.

FIG. 5A shows the display unit 110 and the body unit 120 of the portable device which closely adjoin each other, in which the first surface of the display unit 110 faces forward. In this state, a user can slide the display unit 110 by applying force thereto in two o'clock direction on the paper surface. Then, the display unit 110 can smoothly move and slide, since the protrusions 430 closely adjoin the first guide recesses of the sidewalls, thereby reducing vibration. The elastic members 475 and the rotation holding members 485 integrally move with the display unit 110, since they are fixed to the display unit 110.

Figure 5B:
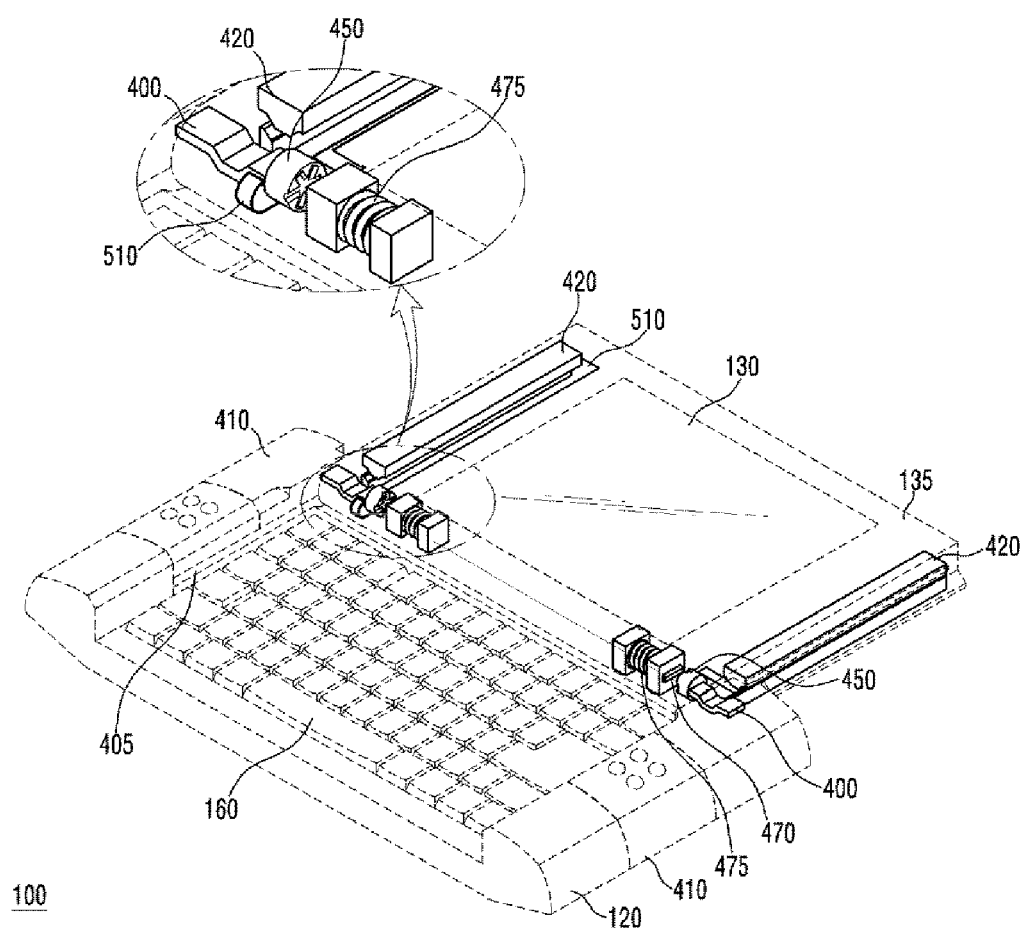

FIG. 5B is a view showing the state in which the display unit 110 has completed sliding and cannot slide any further. After the display unit 110 has started sliding, the display unit 110 stops sliding at the moment that the linear protrusions 470 of the rotation holding members 485 are inserted into the recesses of the interlock members 450. Since the recesses of the interlock members 450 are partially closed by stepped portions, the display unit cannot move further outward in the horizontal direction. While the display unit 110 is sliding, the movement holes 425 stay closed by the guide rails 420. Therefore, it is possible to prevent external foreign matters from entering the inside of the display unit 110. It is also possible to prevent a cable from being damaged by a sharp tool such as an awl.

In addition, the cable 510 is disposed such that it is drawn from the body unit 120 and extends through the central portion of the fixed hinge shaft 400. After the cable 510 is drawn downward of the display unit 110 from the central portion of the fixed hinge shaft 400, it is twisted or bent once, and extends across the space below the fixed hinge shaft 400. After the cable 510 passes through the space below the fixed hinge shaft 400, it is twisted or bent once and then adjoins and is coupled with the area of the display unit 110 adjacent to the ceiling. Alternatively, the cable 510 adjoins and is coupled with the area of the display unit 110 opposite the ceiling without being twisted or bent.

Figure 5C:
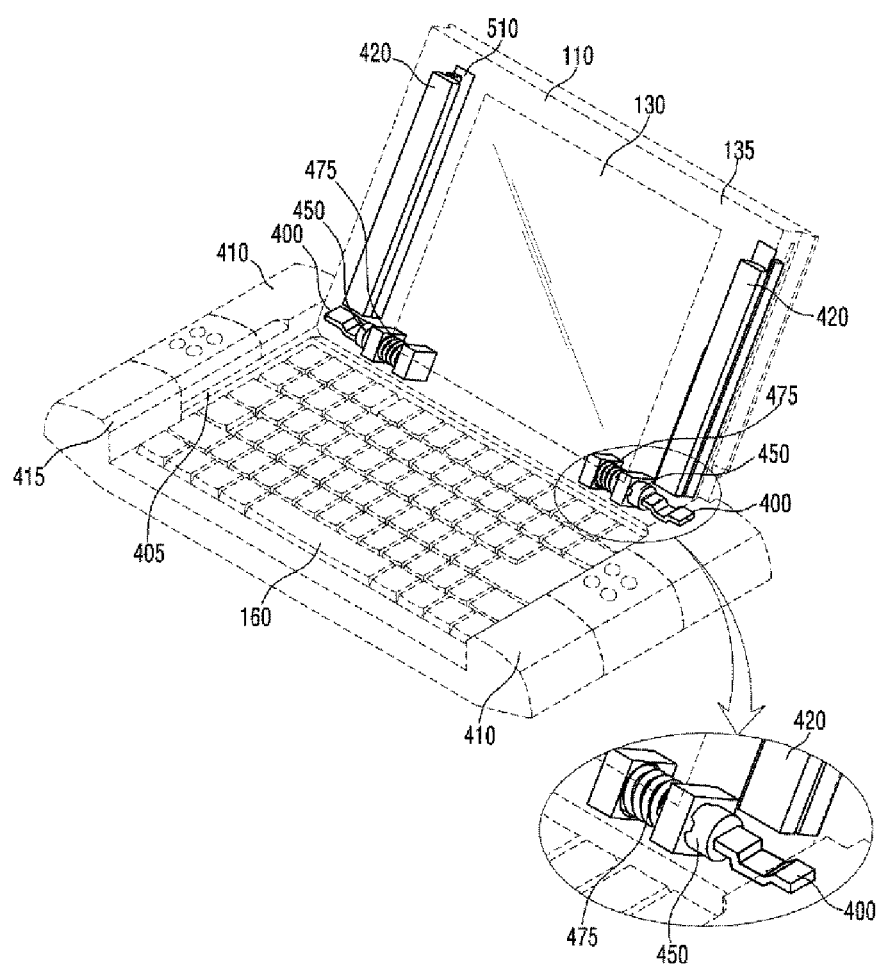

FIG. 5C is a view showing the display unit 110 which has rotated and is at an incline when the display unit 110 is rotated about the sidewalls 410. When the display unit has completed sliding, the linear protrusions 470 of the rotation holding members are inserted into the horizontal recesses of the interlock members 450 attached to the terminal ends of the fixing hinge shafts 400 of the display unit 110. When force for rotating the display unit 110 is applied in this state, the rotation holding members 485, each of which has each elastic member 475 inserted into one end thereof, slightly retract due to elastic contraction. When the display unit 110 is rotated further from this position, the linear protrusions 470 of the rotation holding members 485 can be engaged into one or more recesses that have a different angle from the horizontal recesses of the interlock members 450. That is, the linear protrusions 470 of the rotation holding members 485 are inserted into the recesses of the interlock members 450 due to elastic force generated by the elastic members 475.

In this fashion, the display unit 110 is fixed at a predetermined angle (e.g. 30°, 45°, 60° or the like) with respect to the body unit 120. Consequently, the user can use the portable device as a small computer using the keyboard 160 disposed on the body unit 120 and the first display 130 of the display unit 110. A variety of commercially distributed operating systems (OS) loaded in the portable device in order to control the operation of the portable device.

Figure 5D:
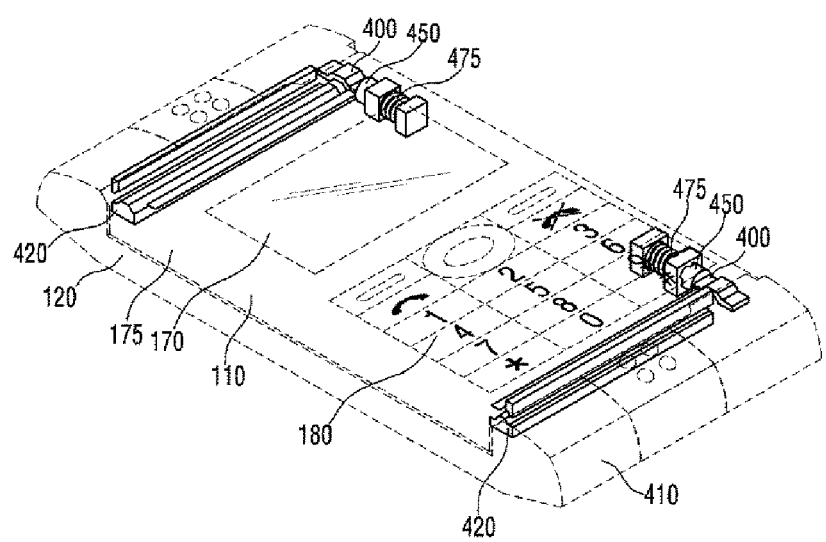

FIG. 5D is a view showing the display unit 110 which has been rotated further from the position shown in FIG. 3C so that the second display 170 and the keypad of the display unit face forward.

When force for rotating the display unit 110 is applied, the linear protrusions 470 on terminal ends of the rotation holding members of the display unit are forced to dislodge from the interlock members 450. This force causes the elastic members 475 to be pushed backward and the linear protrusions 470 are dislodged from the recesses. Since the linear protrusions 470 of the rotation holding members 485 are dislodged from the recesses of the interlock members 450, the display unit 110 can be rotated by a small amount of force. The rotation fixing shafts 400 act as the center of rotation, and are surrounded by the circular holes 435 which are formed in the side surfaces of the display unit 110 and have the shape of a cylinder, so that the rotation can be smoothly carried out.

When the rotation has been completed, the protrusions 430 of the display unit 110 are closely inserted into the second guide recesses 415 of the body unit 120. It is preferred that the sidewalls 410 and the inserted protrusions 430 be designed such that there are no stepped portions therebetween.

Figure 6A:
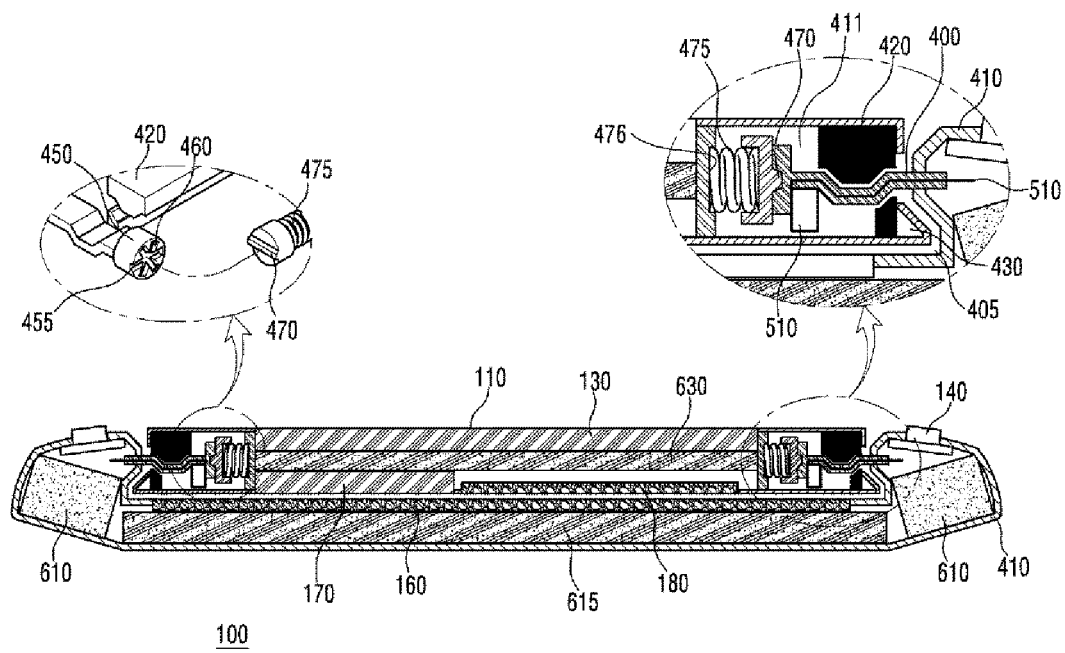
FIG. 6A is a front view showing the portable device according to the first embodiment of the invention.

FIG. 6A is a front view showing a portable device according to an embodiment of the invention.

In addition to the above-described features, the body unit 120 has another advantage in that the thickness of the central portion of the body unit 120 can be reduced by disposing batteries 610 in both side sections such that they are oriented at predetermined angles. In addition, the bottom of the body unit 120 can be made of metal. When the bottom of the body unit 120 is made of metal, it is possible to easily dissipate heat that has been generated from a printed circuit board (PCB) 615 which is located in the central portion of the body unit and on which components and circuits are mounted. Consequently, it is not required to dispose an additional heat dissipating member inside the body unit 120, which is advantageous. The body unit 120 also has the keyboard 160 on the top portion thereof. The display unit 110 includes the first display 130, the second display 170 and the keypad 180.

The first display 130 of the display unit 110 basically operates together with the keyboard 160 of the body unit 120, and is operated by a processor, a memory or the like which is equipped in the body unit 120. Signals can be transmitted between the keyboard 160 and the first display 130 via the cable 510.

In addition, the cable 510 also allows semiconductor components, processors and memories which are disposed on the PCB 615 of the body unit 120 to share resources with semiconductor components, processors and memories which are disposed on a PCB 630 of the display unit 110. That is, the processors or memories in one part can use resources of the processors or memories in the other part when their capacities are insufficient.

Figure 6B:
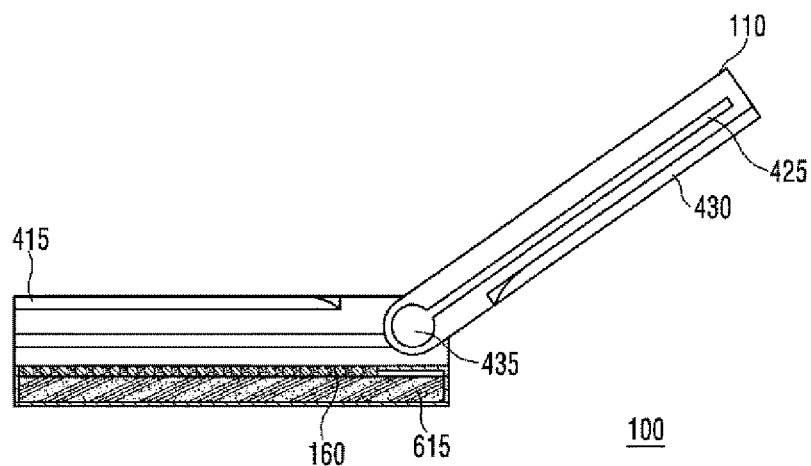
FIG. 6B is a side elevation view showing the portable device according to the first embodiment of the invention.

FIG. 6B is a side elevation view showing the portable device according to an embodiment of the invention.

The movement holes 425 or protrusions 430 can be formed in both side surfaces of the display unit 110, and the circular holes 435 can be formed on the terminal ends of the movement holes 425. The protrusions 430 are configured such that they can respectively rest in the second guide recesses 415 of the body unit.

Figure 7A:
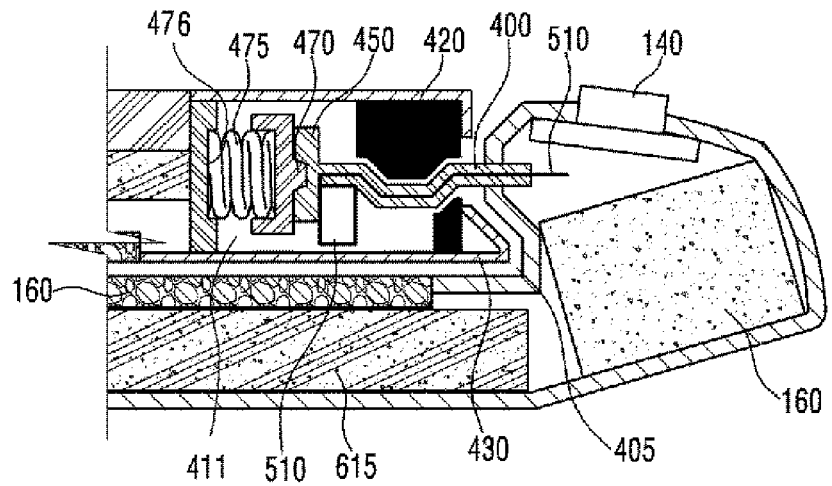
FIG. 7A and FIG. 7B are enlarged views showing the fixed hinge shaft of the portable device according to the first embodiment of the invention.
Figure 7B:
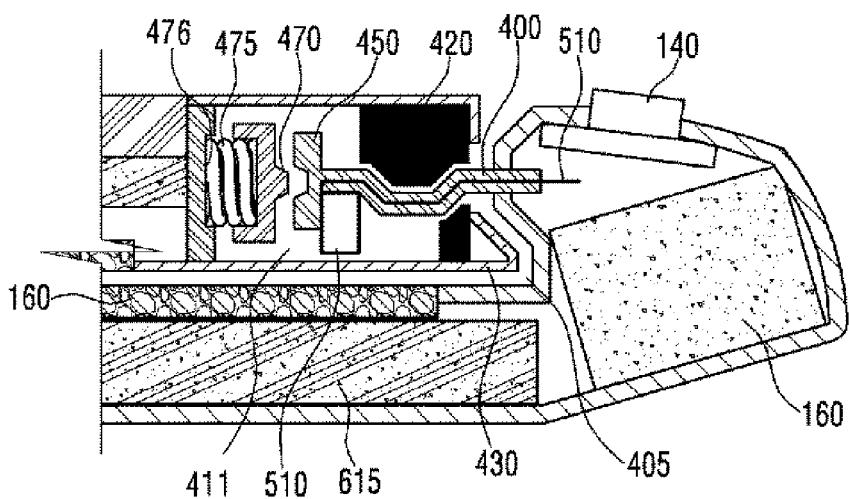

FIG. 7A and FIG. 7B are enlarged views showing one of the fixed hinge shafts 400 of the portable device according to an embodiment of the invention.

The fixed hinge shaft 400 is fixed to the sidewall 410 of the body unit 120, and stays fixed to the body unit 120 without movement while the display unit 110 is rotating. In addition, the cable 510 is disposed through the inside of the fixed hinge shaft 400, such that it is not damaged by external impacts in spite of rotation of the display unit 110. The protrusion 430 of the display unit 110 rests in the first guide recess 405 of the body unit 120. Consequently, when the display unit 110 is sliding, vibration is not applied.

The guide rail 420 is configured such that it can close the movement hole, thereby preventing foreign matters from entering and the inside cable or circuit from being damaged by a sharp object. The elastic member 475 provides the rotation holding member 485 with restoring force. The restoring force allows the protrusion 470 to be attached to or detached from the linear recess 455. The body unit 120 can also include the PCB therein. A fixing stepped portion 476 which prevents the elastic member 475 from being dislodged outward, the fixing stepped portion 476 surrounding and fixing one end of the elastic member 475. The elastic member 475 is disposed inside the insert recess 411, and the central portion of the fixed hinge shaft has a flat shape.

Figure 8A:
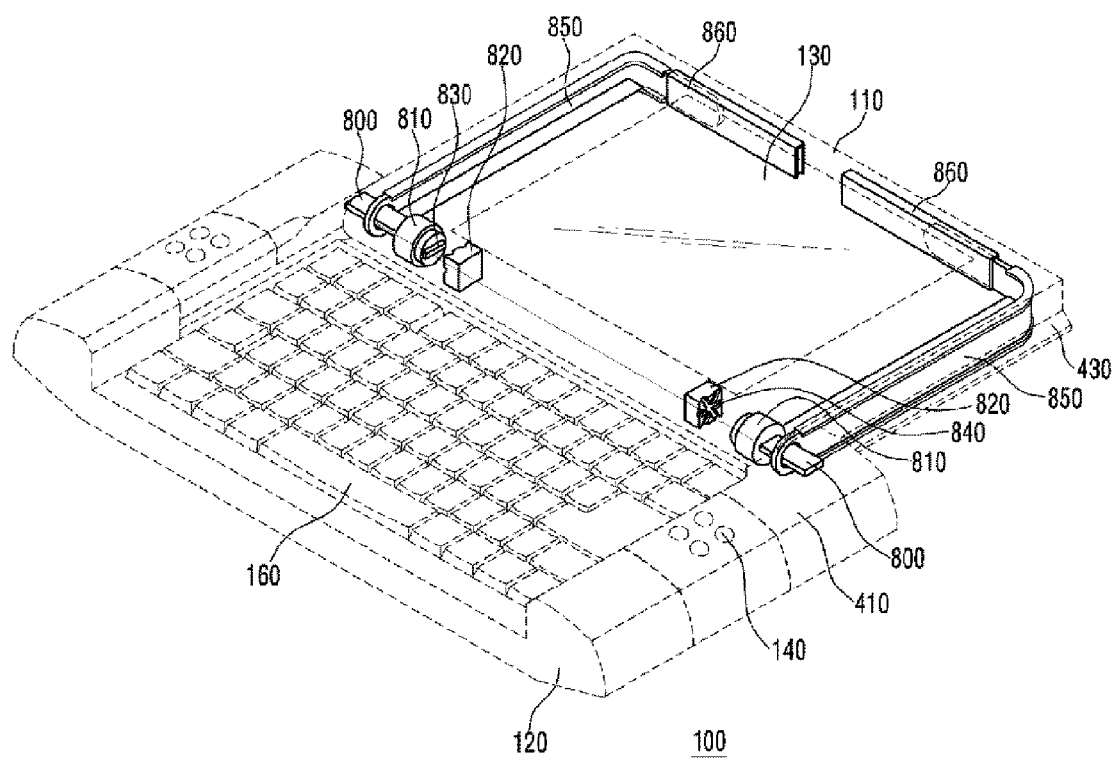
FIG. 8A is a perspective view showing a portable device according to another embodiment of the invention.
Figure 8B:
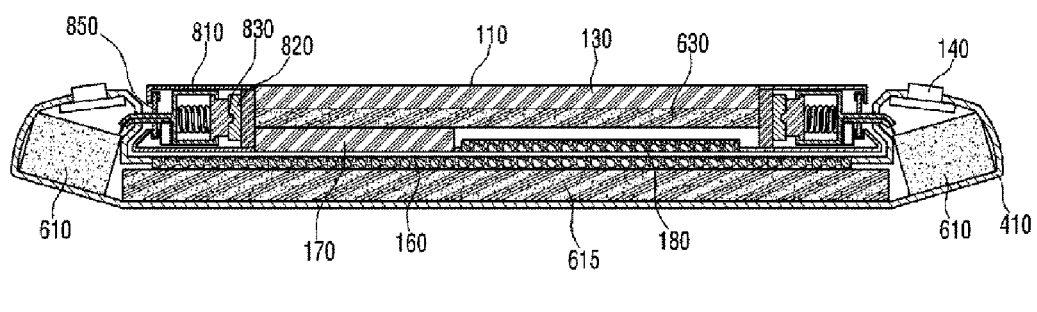
FIG. 8B is a front view showing the portable device according to another embodiment of the invention

FIG. 8A is a perspective view showing a portable device according to another embodiment of the invention, and FIG. 8B is a front view showing the portable device according to another embodiment of the invention.

In this embodiment, fixed hinge shafts 800 have a linear shape (linear fixed hinge shafts). The advantage is that the width of the display unit 110 can be decreased more. The display unit 110 can include protective films 850 inside the sidewalls thereof such that the fixed hinge shafts 800 have the linear shape. The display unit 110 includes the protective films 850 disposed inside the sidewalls thereof. The protective films 850 close the movement holes 425 of the display unit 110 from the outside, and can be made of an elastic material. Since the protective films 850 which can close the movement holes 425 are provided in place of the guide rails 420 which were described in the foregoing embodiment, the inside of the display unit 110 is protected. Since the protective films 850 are made of an elastic material, they can be bent while the display unit 110 is sliding. In addition, each protective film 850 has a circular hole, which surrounds each central portion of the fixed hinge shafts 800.

Protective film-receiving recesses 860 are formed in the horizontal direction in the upper part of the display unit 110 adjacent to the inner sidewall. As the display unit 110 slides on the body unit 120, portions of the protective films can enter or exit the protective film-receiving recesses 860. According to the embodiment shown in FIG. 8A, it shall be assumed that the display unit 110 slide in the first mode and be separated from the body unit 120. Specifically, the protective films 850 are located inside the protective film-receiving recesses 860 when the display unit 110 is in the first mode. As the display unit slides in the first mode, the protective films 850 slip from the protective film-receiving recesses 860, thereby closing the movement holes 425 formed in the display unit 110.

In this embodiment, each of the fixed hinge shafts 800 is configured as two sections, and can also include a ring which surrounds the two sections in order to prevent the two sections from being widened by external force.

Figure 9A:
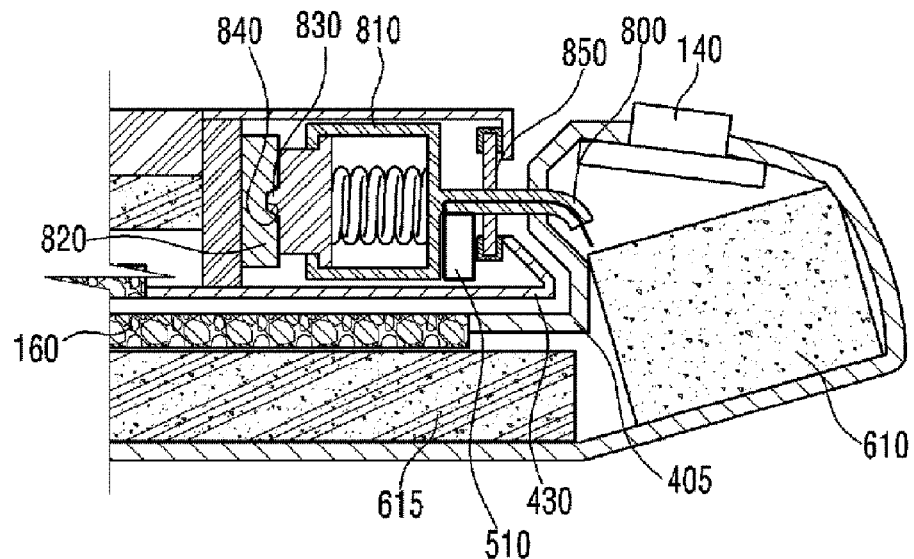
FIG. 9A and FIG. 9B are enlarged views of the fixed hinge shaft of the portable device according to another embodiment of the invention.
Figure 9B:
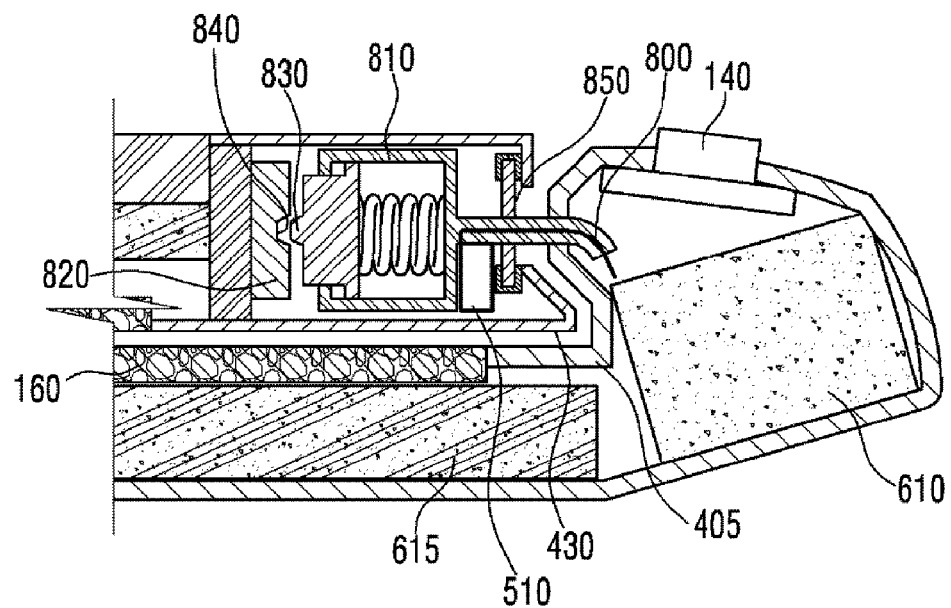

FIG. 9A and FIG. 9B are enlarged views of one of the fixed hinge shafts 800 of the portable device according to another embodiment of the invention.

The fixed hinge shaft 800 has a linear shape without bends, and an elastic member 810 is located adjacent to the fixed hinge shaft 800. A coupling protrusion 830 is formed at a position outside the elastic member, and one or more coupling recesses 840 are formed in a rotation fixing section 820 which is opposite the coupling protrusion. Since the horizontal recess of one or more coupling recesses 840 is closed at one end thereof as described above, the display unit 110 which has been sliding in the horizontal direction is fixed and stops. When rotating force is applied to the display unit 110, the coupling protrusion 830 which has been supported by the elastic member 810 is decoupled from the coupling recess 840 and is then coupled with the coupling recess 840 having a different angle. Based on this principle, the display unit 110 can be fixed at a predetermined angle with respect to the body unit 120.

According to this embodiment, the fixed hinge shaft 800 has a linear shape instead of a curved shape, it is possible to remove as much empty space as possible inside the display unit 110, thereby advantageously reducing the width of the display unit 110.

Second Embodiment

Figure 10:
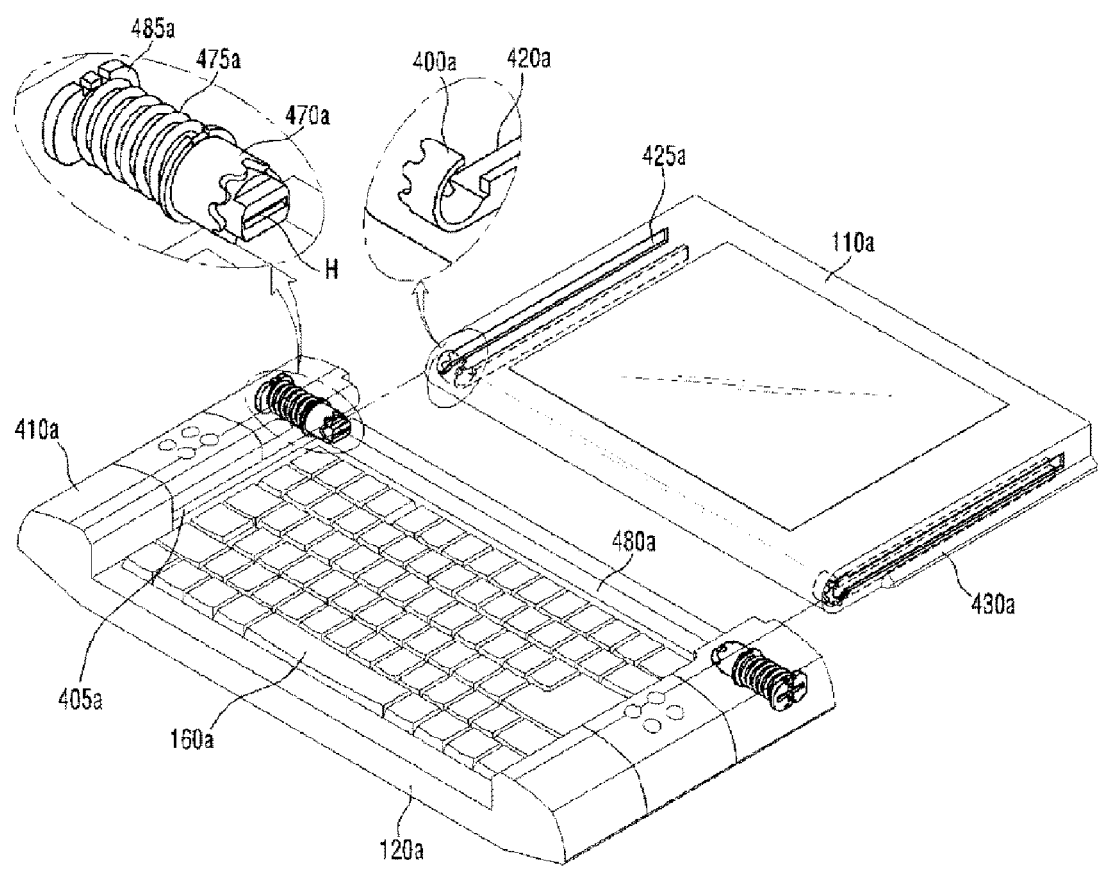
FIG. 10 is an exploded perspective view illustrating the structure of a portable device according to a second embodiment of the invention.

FIG. 10 is an exploded perspective view illustrating the structure of a portable device according to a second embodiment of the invention.

In the second embodiment, the structures of a body unit 120*a*, a display unit 110*a*, sidewalls 410*a*, protrusions 430*a*, guide recesses 405*a*, grooves 480*a*, and a keyboard 160*a* are the same as those of the first embodiment which are designated with corresponding reference numerals. Therefore, descriptions thereof will be omitted herein for the sake of brevity.

According to the second embodiment, holding members 485*a* that can be considered to correspond to the rotation holding members 485 of the first embodiment are partially inserted into the sidewalls 410*a* instead of the inside of the display unit 110*a*. Each of the holding members 485*a* is configured such that one portion thereof is inserted into the sidewall 410*a* and the other portion thereof is inserted into the display unit 110*a* such that it can move. In addition, unlike the first embodiment, rotary hinge shafts 400*a* which can be considered to correspond to the fixed hinge shafts 400 of the first embodiment are inserted into the display unit 110*a*. Each of the rotary hinge shafts 400*a* is configured as a C-shaped ring in which a portion of the respective holding member 485*a* that is inserted into the display unit 110*a* can rest in the ring. Thus, when the display unit 110*a* slides on the body unit 120*a*, the holding members 485*a* are introduced into the openings of the rotary hinge shafts 400*a* which are configured as a C-shaped ring. After the holding members 485*a* have been introduced into the rotary hinge shafts 400*a*, the rotary hinge shafts 400*a* serve as a stopper, thereby causing the display unit 110*a* to stop sliding on the body unit 120*a*.

The display unit 110*a* has movement holes 425*a* formed in the side surfaces thereof. Predetermined portions of the holding members 485*a* respectively extend through the movement holes 425*a* such that the display unit 110*a* can slide on the body unit 120*a*. The width of each movement hole 425*a* is determined to be equal to or greater than the width of the sliding surface of each holding member 485*a* which protrudes beyond protrusions and recesses formed in the circumference of an interlock member 470*a*, such that the holding member 485*a* can smoothly move without friction.

Each holding member 485*a* is located in the inner surface of the sidewall 410*a* of the body unit 120*a*, specifically, adjacent to one end of the inner surface (i.e., an end portion), and serves as the center of rotation when the display unit 110*a* rotates. When the display unit 110*a* is moving in the second mode after having slid from the first mode, the holding member also acts as a stopper which prevents the display unit from sliding any further.

The interlock member 470*a* is formed on at least a portion of the holding member 485*a*. The interlock member 470*a* surrounds the outer circumference of the holding member 485*a* and engages with the rotary hinge shaft 400*a*. One end of the interlock member 470*a* engages with the rotary hinge shaft 400*a*, and the other end of the interlock member 470*a* and one end of opposite ends of the holding member 480*a* which is disposed inside the body unit 120*a* are connected to each other via an elastic member 475*a* which surrounds the outer circumference of the holding member 485*a*. The elastic member 475*a* provides the interlock member 470*a* with elastic force that is in the axial direction of the holding member 485*a*, using one end of the holding member 485*a* as a fixed end. In the opposite ends of the elastic member 475*a*, one end is fixed to the terminal end of the fixed member 485*a* and the other end is fixed to one end of the interlock member 470*a* in order to prevent the interlock member 470*a* which surrounds the outer circumference of the holding member 485*a* from being separated from the holding member 485*a*. According to a preferred embodiment, as shown in FIG. 10, one end of the opposite ends of the holding member 485*a* which is disposed inside the body unit 102*a* has a fixing stepped portion. An insert recess can be formed in the fixing stepped portion. The distal end of the elastic member 475*a* which has the shape of a spring can be inserted into the insert recess. The distal end that has been inserted into the insert recess can be bent and fixed to the insert recess. In addition, as shown in FIG. 10, a fixing stepped portion can also be formed on one end of the opposite ends of the interlock member 470*a* which adjoins the elastic member 475*a*. The distal end of the elastic member 475*a* can be inserted into the insert recess formed in the fixing stepped portion of the interlock member 470*a*. The distal end that has been inserted into the insert recess can be bent and fixed to the insert recess. In this fashion, the elastic member 475*a* can be fixed between one end of the holding member 485*a* and the interlock member 470*a*, thereby preventing the interlock member 470*a* from being separated or dislodged.

The outer diameter of the interlock member 470*a* is formed to be equal to the outer diameter of the rotary hinge shaft 400*a*, such that the outer circumference of the interlock member 470*a* adjoins and engages with the outer circumference of the rotary hinge shaft 400*a*. A protrusion and a recess are respectively formed in the circumference of the interlock member 470*a* and the circumference of the rotary hinge shaft 400*a*. It is preferred that the circumference of the interlock member 470*a* and the circumference of the rotary hinge shaft 400*a* be formed in the shape of waves. When the recess of the interlock member 470*a* and the protrusion of the rotary hinge shaft 400*a* engage with each other or the protrusion of the interlock member 470*a* and the recess of the rotary hinge shaft 400*a* engage with each other, the elastic force of the elastic member 475*a* is minimized. In contrast, when the protrusion of the interlock member 470*a* and the protrusion of the rotary hinge shaft 400*a* adjoin each other, the elastic force of the elastic member 475a is maximized. Consequently, the interlock member 470a and the rotary hinge shaft 400a can firmly engage with each other at a point where the elastic force of the elastic member 475a is minimized. That is, the interlock member 470a and the rotary hinge shaft 400a engage with each other such that the display unit 110a and the body unit 120a are fixed at a predetermined angle (e.g. 30°, 45°, 60° or the like) with respect to each other, and rotate in this state.

Figure 11A:
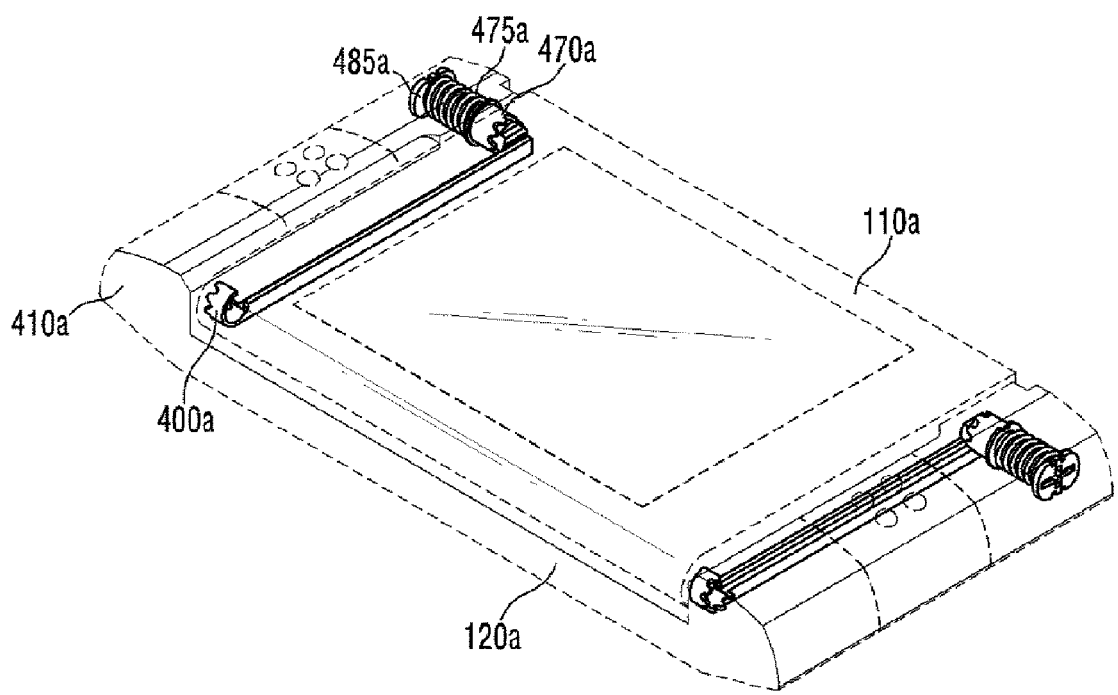
FIGS. 11A and 11B are perspective views showing the display unit of the portable device according to the second embodiment of the invention which sequentially moves on the body unit.
Figure 11B:
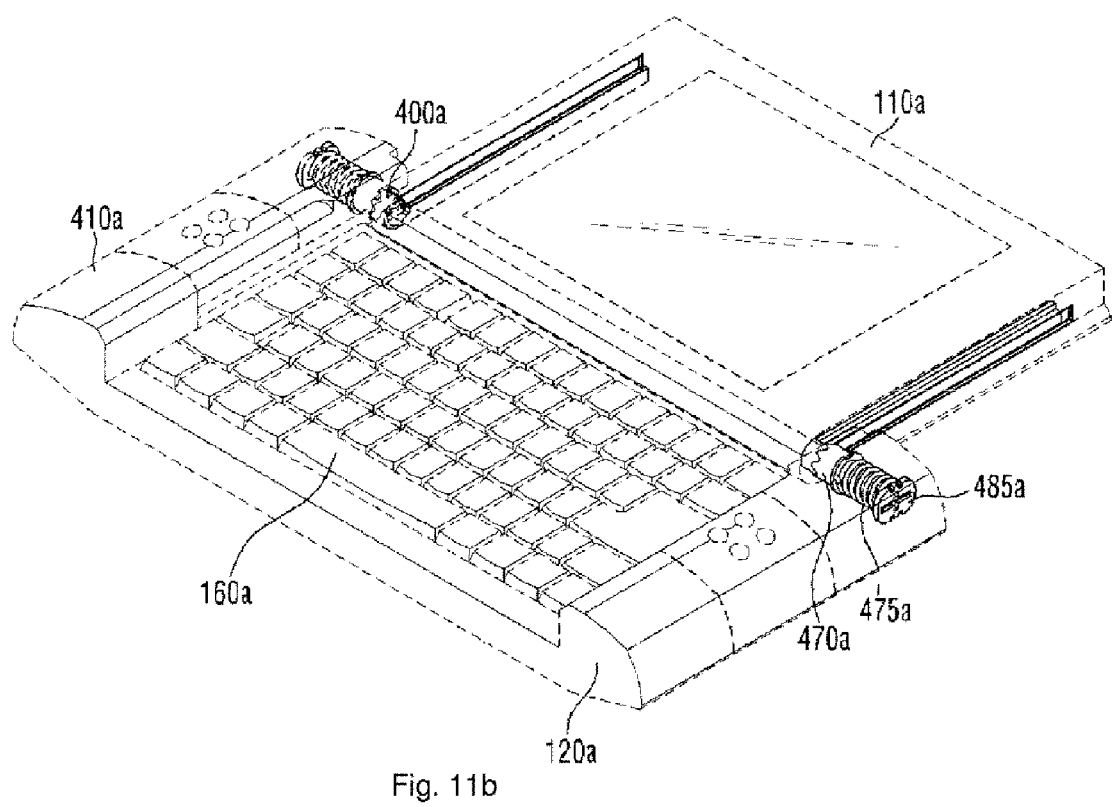

FIGS. 11A and 11B are perspective views showing the display unit 110a of the portable device according to the second embodiment of the invention which sequentially moves on the body unit 120a.

FIG. 11A shows the display unit 110a and the body unit 120a of the portable device which closely adjoin each other in the state where the first surface of the display unit 110a faces forward. In this state, the user can slide the display unit 110a by applying force thereto in two o'clock direction on the paper surface.

FIG. 11B is a view showing the display unit 110a which has completed sliding and cannot slide any further. After the display unit 110a has started sliding, it stops sliding when the holding member 485a is inserted into the opening of the rotary hinge shaft 400a which is configured as the C-shaped ring and is stopped by the hinge shaft 400a. The opening of the rotary hinge shaft 400a can be in contact with the guide rail 420a. The guide rail 420a helps the holding member 485a to reliably move when the display unit is sliding, and allows the holding member 485a to safely rest inside the rotary hinge shaft 400a.

At the moment that the holding member 485a rests inside the rotary hinge shaft 400a, the protrusion of the interlock member 470a which surrounds the outer circumference of the holding member 485a and the recess of the rotary hinge shaft 400a engage with each other and the recess of the interlock member 470a and the protrusion of the rotary hinge shaft 400a engage with each other.

Afterwards, the holding member 485a rotates inside the rotary hinge shaft 400a. When the holding member 485a rotates, the interlock member 470a and the rotary hinge shaft 400a engage with each other. When the interlock member 470a and the rotary hinge shaft 400a rotate in the engaged state, the elastic force of the elastic member 475a is adjusted in the axial direction of the holding member 485a. As the holding member 485a and the rotary hinge shaft 400a rotate about each other, the display unit 110a rotates at a predetermined angle about the body unit 120a. Here, the interlock member 470a and the rotary hinge shaft 400a also rotate about each other. In this process, when the protrusion of the interlock member 470a and the protrusion of the rotary hinge shaft 400a adjoin each other, the elastic force of the elastic member 475a becomes maximum. Therefore, the interlock member 470a and the rotary hinge shaft 400a are characterized in that their protrusion and recess engage with each other. Consequently, the interlock member 470a and the rotary hinge shaft 400a stop rotation whenever the protrusion and the recess engage with each other. Accordingly, the display unit 110a engages with and rotates about the body unit 120a such that it is fixed at a predetermined angle (e.g., 30°, 45°, 60° or the like) with respect to the body unit.

The display unit 110a continuously rotates until it has the relationship with respect to the body unit 120a as shown in FIG. 5C and FIG. 5D. This process is the same as that of the first embodiment, and thus descriptions thereof will be omitted.

A cable through-hole H axially extends through the holding member 485a, and the cable (not shown) which is drawn from the body unit 120a passes through the cable through-hole H. The cable which has passed through the cable through-hole H can be drawn to the display unit 110a and be fixed thereto. The cable may be implemented as a flexible printed circuit board (FPCB) or the like.

According to the second embodiment of the invention, the rotary hinge shaft 400a is configured as a C-shaped ring. The width of the rotary hinge shaft is the same as the width of the guide rail 420a. Since the holding member 485a and the elastic member 475a are disposed on the body unit 120a instead of the display unit 110a, components which are housed in the display unit 110a can be simplified. Accordingly, the width of the display screen of the display unit 110a can be further increased, whereas the thickness thereof can be decreased.

Figure 12:
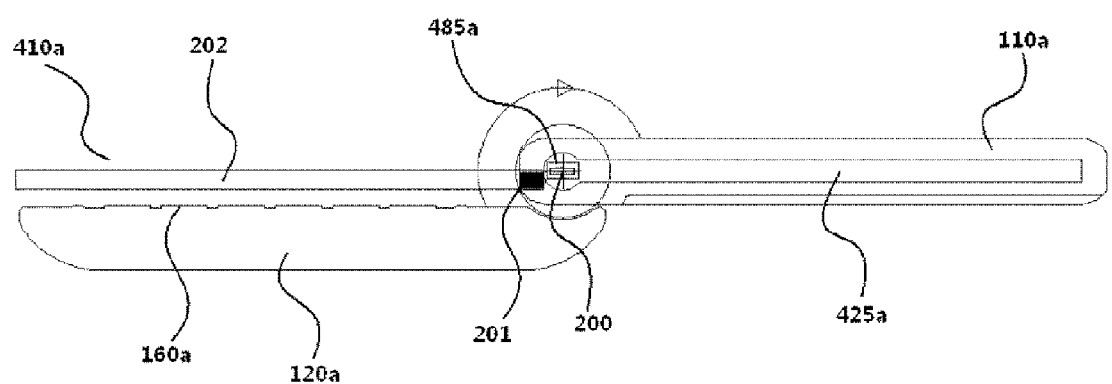
FIG. 12 is a view showing the state in which the lower part of the display unit cannot be raised further above the horizontal line of the rotary shaft just before the display unit starts tilting or rotating after it has stopped sliding.

FIG. 12 is a view showing the state in which the lower part of the display unit 110 or 110a cannot be raised further above the horizontal line of the rotary shaft (i.e. the rotation holding member or the holding member) just before the display unit 110 or 110a starts tilting or rotating after it has stopped sliding.

Raise-preventing stepped portions 201 are disposed on the bottoms of the left and right outer side surfaces of the display unit 110 or 110a. The raise-preventing stepped portions 201 prevent the lower part of the display unit 110 or 110a from being raised further above the horizontal line of the rotary shaft (i.e. the rotation holding member or the holding member) or the upper part of the display unit 110 or 110a from being lowered below the horizontal line 200 of the rotary shaft as the display unit 110 or 110a stops sliding upward on the body unit 120 or 120a (i.e. stops due to completion of sliding), that is, just before the display unit 110 or 110a starts rotation to tilt to a predetermined angle or turn back 180 degrees. In addition, stepped portion slip guide recesses 202 which correspond to the raise-preventing stepped portions 201 are formed along both the sidewalls so that the raise-preventing stepped portions 201 can be inserted into and slide along the inner side surfaces of the sidewalls of the body unit 120 or 120a.

As set forth above, it is apparent to a person having ordinary skill in the art that various changes in forms and details may be made therein without departing from the spirit and essential features of the present invention.

Accordingly, the foregoing embodiments should be regarded as illustrative rather than limiting. The scope of the present invention is not defined by the detailed description as set forth above but by the accompanying claims of the invention. It should also be translated that all alterations or modifications derived from the definitions and scopes of the claims and their equivalents fall within the scope of the invention.

The invention claimed is:

1. A portable device which comprises a display unit and a body unit, the display unit comprising a display screen disposed on at least one of a front surface and a rear surface, wherein:

the body unit comprises sidewalls which protrude forward from left and right side sections of the body unit such that the display unit can rest between the sidewalls;

the sidewalls of the body unit include a fixed hinge shaft, one end of the fixed hinge shaft being fixed to a portion of the sidewalls, a portion of the fixed hinge shaft being located inside the display unit, the display unit has a movement hole in a side surface thereof, the portion of the fixed hinge shaft extending through the movement hole such that the display unit can slide on the body unit;

protrusions are formed on both side surfaces of the display unit, the protrusions extending in a vertical direction;

first guide recesses are formed in inner side surfaces of the sidewalls of the body unit, the protrusions of the display unit being insertable into the first guide recesses so as to slide; and second guide recesses are formed in front surfaces of the sidewalls of the body unit, the second guide recesses allowing the display unit to rotate about the body unit and then closely adjoin the body unit.

2. The portable device of claim 1, wherein the portion of the sidewalls of the body unit to which the fixed hinge shaft is fixed is higher than portions where the first guide recesses are formed, and is located in the inner side surfaces of the sidewalls of the body unit.

3. The portable device of claim 1, wherein a recess which extends in a lateral direction is formed in an upper portion of an area of the body unit between the sidewalls, and a keyboard is disposed in an area below the recess which extends in the lateral direction.

4. The portable device of claim 1, further comprising:
an interlock member having a recess in a surface which faces a sidewall of the sidewalls of the body unit, the interlock member being coupled with the fixed hinge shaft;
a rotation holding member which moves integrally with the display unit when the display unit slides and is coupled with the interlock member to serve as a center of rotation when the display unit rotates; and
an elastic member which provides elastic force to the rotation holding member,
wherein the fixed hinge shaft has a bent central portion.

5. The portable device of claim 4, further comprising a fixing stepped portion which surrounds, supports and fixes one end of the elastic member, thereby preventing the elastic member from being dislodged outward.

6. The portable device of claim 5, wherein
the interlock member has a first linear recess in a surface which is opposite the surface coupled with the corresponding fixed hinge shaft, the first linear recess being formed parallel to a direction in which the display unit slides and closed in one direction, and one or more second linear recesses formed a different angle from the first linear recess,
the rotation holding member has a linear protrusion on a surface which faces a corresponding sidewall of the sidewalls of the body unit, the linear protrusion being formed parallel to the direction in which the display unit slides, and
the linear protrusion of the rotation holding member is insertable into at least one of the first linear recess and the one or more second linear recesses.

7. The portable device claim 4, wherein the display unit further comprises a guide rail on an inner wall of a front or rear surface thereof, the guide rail being formed along a path along which the bent central portion of the fixed hinge shaft moves when the display unit slides.

8. The portable device of claim 1, further comprising:
a rotation holding member having a linear protrusion on a surface thereof which faces inward, the linear protrusion being formed substantially parallel to a direction in which the display unit slides;
an elastic member which provides restoring force for pushing the rotation holding member outward; and
an interlock member having a first linear recess in a surface which faces the fixed hinge shaft, the first linear recess being formed parallel to the direction in which the display unit slides, and one or more second coupling recesses formed at a different angle from the first linear recess,
wherein the fixed hinge shaft has an insert recess in a terminal end thereof, the insert recess being formed such that an entrance thereof faces a central portion, the elastic member is disposed inside the insert recess, and the central portion of the fixed hinge shaft has a flat shape.

9. The portable device of claim 8, wherein the interlock member moves integrally with the display unit when the display unit slides, and is coupled with the rotation holding member to serve as a center of rotation when the display unit rotates.

10. The portable device of claim 8, wherein the insert recess has a fixing stepped portion, the rotation holding member has a stepped portion such that an outer portion thereof is thicker, and the fixing stepped portion of the insert recess and the stepped portion of the rotation holding member prevent the rotation holding member from being dislodged from the insert recess.

11. The portable device of claim 8, wherein the display unit further comprises a protective film disposed inside a sidewall thereof, the protective film closing the movement hole from an outside, the protective film being made of an elastic material.

12. The portable device of claim 11, wherein a portion of the protective film which adjoins the fixed hinge shaft has a circular shape;
wherein the display unit further comprises a protective film-receiving recess in an upper part thereof adjacent to the inner sidewall, the protective film-receiving recess being laterally formed; and
a portion of the protective film enters and exits the protective film-receiving recess as the display unit slides on the body unit.

13. The portable device of claim 12, wherein the fixed hinge shaft is divided into two sections, and further comprises a ring which surrounds the two sections in order to prevent the two sections from being widened by external force.

14. The portable device of claim 1, wherein raise-preventing stepped portions are disposed on bottom portions of left and right outer side surfaces of the display unit so that a lower part of the display unit is not raised further above a horizontal line of the rotary shaft as the display unit stops sliding upward on the body unit (i.e. stops due to completion of sliding), and stepped portion slip guide recesses which correspond to the raise-preventing stepped portions are formed along both the sidewalls so that the raise-preventing stepped portions can be inserted into and slide along inner side surfaces of the sidewalls of the body unit.

15. A portable device comprising:
a display unit having a display screen on a front surface and a display screen on a rear surface; and
a body unit comprises sidewalls on opposite side sections thereof such that the display unit rests between the sidewalls, wherein the display unit rotates 180 degrees after having slid along the sidewalls so that the display screen disposed on the rear surface can be exposed forward, wherein:
the sidewalls of the body unit include a holding member, one end of the holding member being fixed to a portion of the sidewalls, a portion of the holding member being located inside the display unit; and
the display unit has a movement hole in a side surface thereof, the portion of the holding member extending through the movement hole such that the display unit can slide on the body unit.

16. The portable device of claim 15, wherein the display unit comprises a rotary hinge shaft in a side portion thereof, the rotary hinge shaft being configured as a C-shaped ring which has an opening, the opening being formed in a direction opposite to a direction in which the display unit slides, such that the holding member can rest into the rotary hinge shaft configured as the C-shaped ring through the opening.

17. The portable device of claim 16, wherein
an interlock member is disposed in at least a portion of the holding member, the interlock member surrounding an outer circumference of the holding member, an outer diameter of the interlock member being equal to an outer diameter of the rotary hinge shaft, the interlock member adjoining the rotary hinge shaft when the holding member rests inside the rotary hinge shaft, and
an elastic member is disposed between one end of both ends of the interlock member and one end of both ends of the holding member which are disposed on a sidewall of the sidewalls of the body unit, the elastic member surrounding the holding member.

18. The portable device of claim 17, wherein surfaces of the rotary hinge shaft and the interlock member which adjoin each other have a plurality of protrusions and recesses, and wherein elastic force of the elastic member is maximum when the protrusions formed on the rotary hinge shaft adjoin the protrusions formed on the interlock member.

19. The portable device of claim 16, further comprising a guide rail extending from the opening of the rotary hinge shaft, the guide rail guiding a movement of the holding member when the display unit slides.

20. The portable device of claim 15, wherein raise-preventing stepped portions are disposed on bottom portions of left and right outer side surfaces of the display unit so that a lower part of the display unit is not raised further above a horizontal line of the rotary shaft as the display unit stops sliding upward on the body unit (i.e. stops due to completion of sliding), and stepped portion slip guide recesses which correspond to the raise-preventing stepped portions are formed along both the sidewalls so that the raise-preventing stepped portions can be inserted into and slide along inner side surfaces of the sidewalls of the body unit.

* * * * *